[12] United States Patent
Ishikawa (10) Patent No.: US 6,252,992 B1
(45) Date of Patent: *Jun. 26, 2001

(54) VARIABLE LENGTH CODING

(75) Inventor: Hisashi Ishikawa, Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/512,200

(22) Filed: Aug. 7, 1995

(30) Foreign Application Priority Data

Aug. 8, 1994 (JP) .................................................. 6-185934

(51) Int. Cl.⁷ ................................. G06K 9/36; G06K 9/46
(52) U.S. Cl. ........................... 382/239; 382/246; 341/65; 341/107; 358/427
(58) Field of Search ..................................... 382/246, 239; 358/261.1, 261.2, 261.3, 427, 430; 341/51, 55, 59, 60, 65, 67, 106, 107

(56) References Cited

U.S. PATENT DOCUMENTS

| | | | | |
|---|---|---|---|---|
| 4,355,306 | * | 10/1982 | Mitchell | 358/261.2 |
| 4,420,771 | * | 12/1983 | Pirsch | 358/261 |
| 4,578,704 | * | 3/1986 | Gharavi | 341/107 |
| 4,700,175 | * | 10/1987 | Bledsoe | 341/65 |
| 4,799,242 | * | 1/1989 | Vermeulen | 375/241 |
| 4,862,167 | * | 8/1989 | Copeland, III | 341/107 |
| 4,990,910 | * | 2/1991 | Takishima et al. | 341/67 |
| 5,045,852 | * | 9/1991 | Mitchell et al. | 341/51 |
| 5,182,528 | * | 1/1993 | Zuta | 331/1 A |
| 5,319,682 | * | 6/1994 | Clark | 375/240 |
| 5,465,173 | | 11/1995 | Ishikawa et al. | 358/534 |
| 5,488,616 | * | 1/1996 | Takishima et al. | 341/82 |
| 5,524,170 | * | 6/1996 | Matsuo et al. | 395/2.31 |

OTHER PUBLICATIONS

Huang et al., Windowed Huffman coding algorithm with size adaptation, Apr. 1993, pp. 109–113, IEEE.*
"Dynamic Huffman Coding", D. Knuth, Journal of Algorithms, vol. 6, No. 2 pp. 163–180, Jun. 1985.

* cited by examiner

Primary Examiner—Joh Chang
Assistant Examiner—Timothy M. Johnson
(74) Attorney, Agent, or Firm—Fitzpatrick, Cella, Harper & Scinto (57) ABSTRACT

Entered symbols are converted by a code ID table to code IDs numbered in order of increasing code length. Code IDs outputted by the code ID table are replaced by means of an ID conversion table, after which the outputted codes are delivered to a code table and to a code-length table. A Huffman code outputted by the code table is packed by a packer based upon a Huffman code length outputted by a code-length table. In accordance with the local occurrence probability of entered codes, the ID conversion table 103 is updated per prescribed number of symbols. Accordingly, the correspondence between Huffman codes and symbols is altered dynamically and it is possible to prevent a decline in the efficiency of encoding of data in which there is a dynamic variation in the probability distribution (occurrence probability) of symbols.

12 Claims, 9 Drawing Sheets

VARIABLE LENGTH CODING

BACKGROUND OF THE INVENTION

1. Field of the Invention

This invention relates to an encoding apparatus and method. More particularly, the invention relates to an encoding apparatus and method for performing variable-length coding.

2. Description of the Related Art

Huffman coding is widely known as a data compression method using variable-length coding. With Huffman coding, short code words are allocated, in accordance with the probability distribution of a symbol, in the order of symbol probability, thereby shortening average code length.

A problem encountered with this technique is that since code words are assigned in accordance with the probability distribution of a symbol, coding efficiency declines if there is a change in the symbol probability distribution. In order to overcome this drawback, dynamic Huffman coding has been proposed in literature such as "D. Knuth, "Dynamic Huffman Coding", Journal of Algorithm, Vol. 6, No. 2, pp. 163~180, June, 1985". However, according to dynamic Huffman coding, Huffman codes are reconstructed by computing an occurrence probability whenever a code is entered. As a consequence, a large amount of hardware (or computation) is required.

SUMMARY OF THE INVENTION

An object of the present invention is to solve the foregoing problem and provide an encoding apparatus and method wherein a decline in the efficiency of encoding of data in which symbol probability distribution (occurrence probability) varies dynamically is prevented by a simple arrangement or through simple processing.

According to a preferred embodiment of the present invention, the foregoing object is attained by providing an encoding apparatus comprising evaluating means for obtaining local occurrence probabilities of entered symbols, and assigning means for assigning short code words in conformity with the order of the occurrence probabilities obtained by the evaluating means.

Further, the foregoing object is attained by providing an encoding apparatus comprising first converting means for converting entered symbols to code IDs numbered in order of increasing code length, replacing means for replacing the code IDs, which have been outputted by the first converting means, in accordance with a replacement table, and second converting means for converting code IDs, which have been outputted by the replacing means, to code words arrayed in order of increasing code length; wherein the replacement table is updated, in units of a prescribed number of symbols, in conformity with generation frequency of symbols in the past.

Further, the foregoing object is attained by providing an encoding apparatus comprising evaluating means for obtaining local occurrence probabilities of entered symbols, and replacing means which, if ranking of occurrence probabilities obtained by the evaluating means changes, replaces the symbols in conformity with the changed ranking.

Further, the foregoing object is attained by providing an encoding method comprising an evaluation step of obtaining local occurrence probabilities of entered symbols, and an assigning step of assigning short code words in conformity with the order of the occurrence probabilities obtained at the evaluating step.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENTS

Embodiments according to the present invention will now be described in detail with reference to the drawings.

Figure 1:
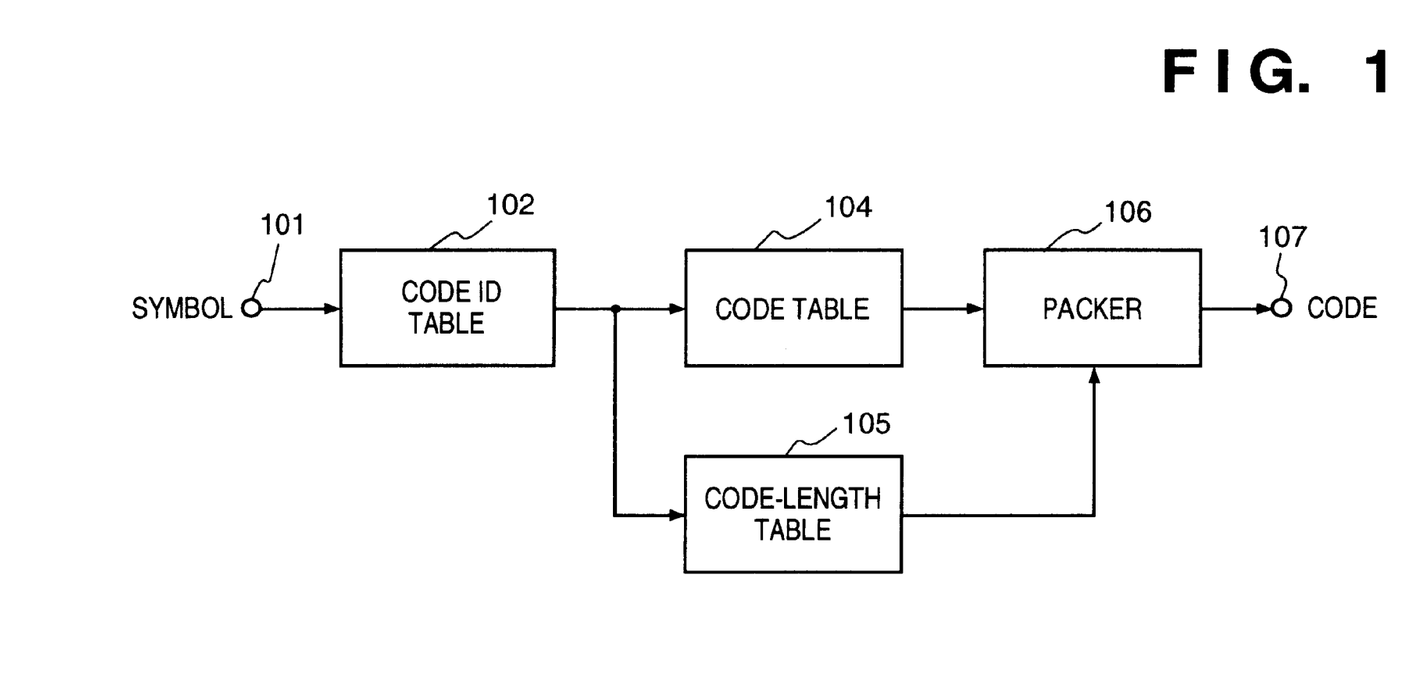
FIG. 1 is a block diagram illustrating the basic construction of a Huffman coder.

The basic construction of a Huffman coder will be described first with reference to FIG. 1. As shown in FIG. 1, the Huffman coder has an input terminal 101, a code ID table 102, a code table 104, a code-length table 105, a packer 106 and an output terminal 107.

The code ID table 102 converts symbols, which have entered from the input terminal 101, to code IDs numbered in order of increasing code length. A code ID outputted by the code ID table 102 is converted to a Huffman code and to a code length by the code table 104 and code-length table 105, respectively. On the basis of the Huffman code length which has entered from the code-length table 105, the packer 106 packs the Huffman code outputted by the code table 104 and delivers the packed code to the output terminal 107 as a bit stream. In order to simplify the hardware the code ID table 102, code table 104 and code-length table 105 are consolidated and constructed as a single look-up table (hereinafter referred to as a "LUT").

First Embodiment

Figure 2:
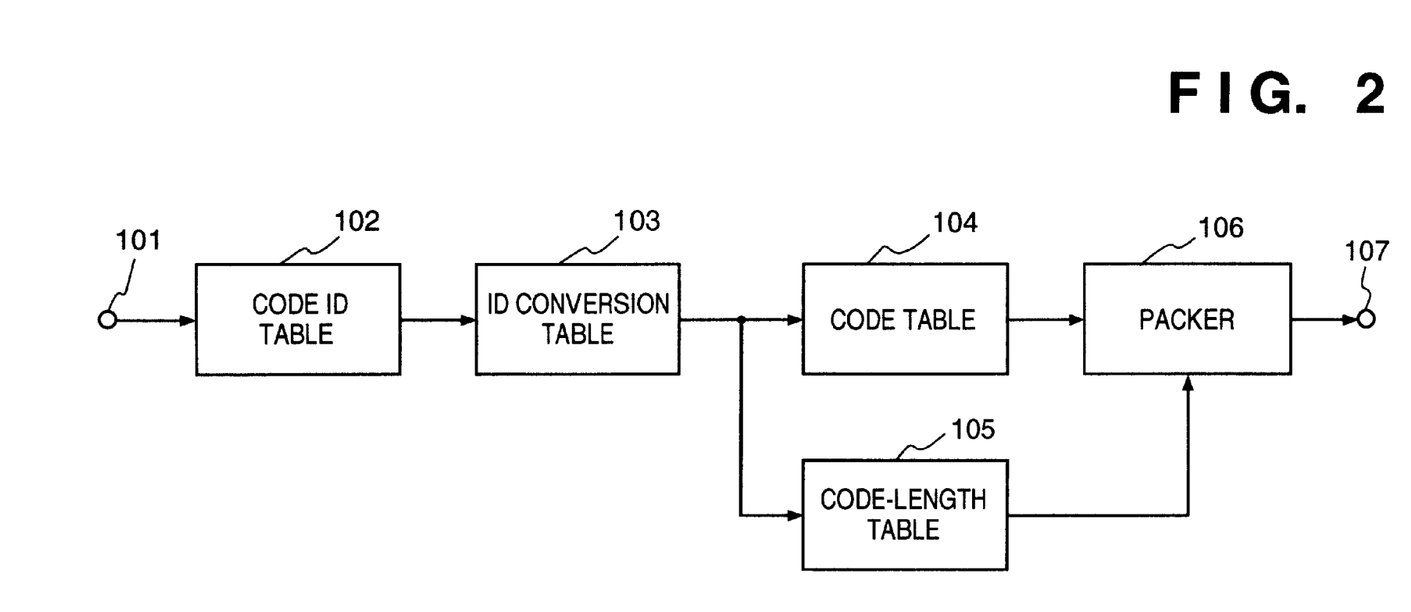
FIG. 2 is a block diagram illustrating the construction of an encoder according to a first embodiment of the present invention.

FIG. 2 is a block diagram illustrating the construction of an encoder according to a first embodiment of the present invention. Components identical with those of the encoder shown in FIG. 1 are designated by like reference characters and need not be described again in detail.

The encoder according to this embodiment includes an ID conversion table 103 which replaces the code ID outputted by the code ID table 102. The ID conversion table 103 is updated every prescribed number of symbols (or at every change of frequency) in accordance with the local generation frequency (occurrence frequency) of an entered symbol. In other words, by dynamically modifying the correspondence between Huffman codes and symbols, short code words are assigned in accordance with the local occurrence probability of a symbol, thereby suppressing a decline in encoding efficiency.

The local occurrence probability of a symbol is obtained by evaluation means such as a CPU, not shown, and updating of the ID conversion table 103 is performed by the same CPU. However, in a case where a certain symbol has taken on the same frequency as that of another symbol, the ranking is not changed (the ID conversion table 103 is not updated).

In order to achieve matching on the decoding side, the local occurrence probability of a symbol is obtained from a symbol that has already been outputted. As a result, it is possible to modify the correspondence between Huffman codes and symbols without additional information even on the decoding side.

Since short code words are thus allocated in the order of the local occurrence frequency of symbols, this embodiment is particularly effective in a case where there is a large local change in generation frequency (occurrence frequency). In addition, since the worst values of encoding efficiency are pulled up, a variance in the final quantity of code is suppressed. This is extremely useful in practical applications.

Further, by virtue of the foregoing operation, encoding efficiency becomes significantly dependent upon the probability distribution of code IDs and not the occurrence probability of symbols. As a result, an arrangement may be adopted in which a plurality of the code tables 104 and code-length tables 105 conforming to several kinds of typical occurrence probability distributions are provided and one set of the plurality of code tables 104 and code-length tables 105 is selected in accordance with the local occurrence probability of a code ID. As a result, a further improvement in encoding efficiency can be anticipated and, moreover, overhead for table transmission (updating) can be eliminated.

Though the code ID table 102, ID conversion table 103, code table 104 and code-length table 105 have been described as separate tables, the code ID table 102 and ID conversion table 103 or the four above-mentioned tables may be consolidated and constructed as a single table.

Thus, in accordance with this embodiment as described above, an ID conversion table is provided between a code ID table and a code table (and a code-length table), the ID conversion table is updated in prescribed symbol units in accordance with the generation frequency of symbols in the past and short code words are allocated in the order of symbol generation frequency, thereby making it possible to suppress a decline in encoding efficiency caused by a local change in the order of symbol occurrence probability and to suppress the final amount of code.

Second Embodiment

An encoding apparatus according to a second embodiment of the invention will now be described. Elements in the second embodiment identical with those of the first embodiment are designated by like reference characters and need not be described again in detail.

Figure 3:
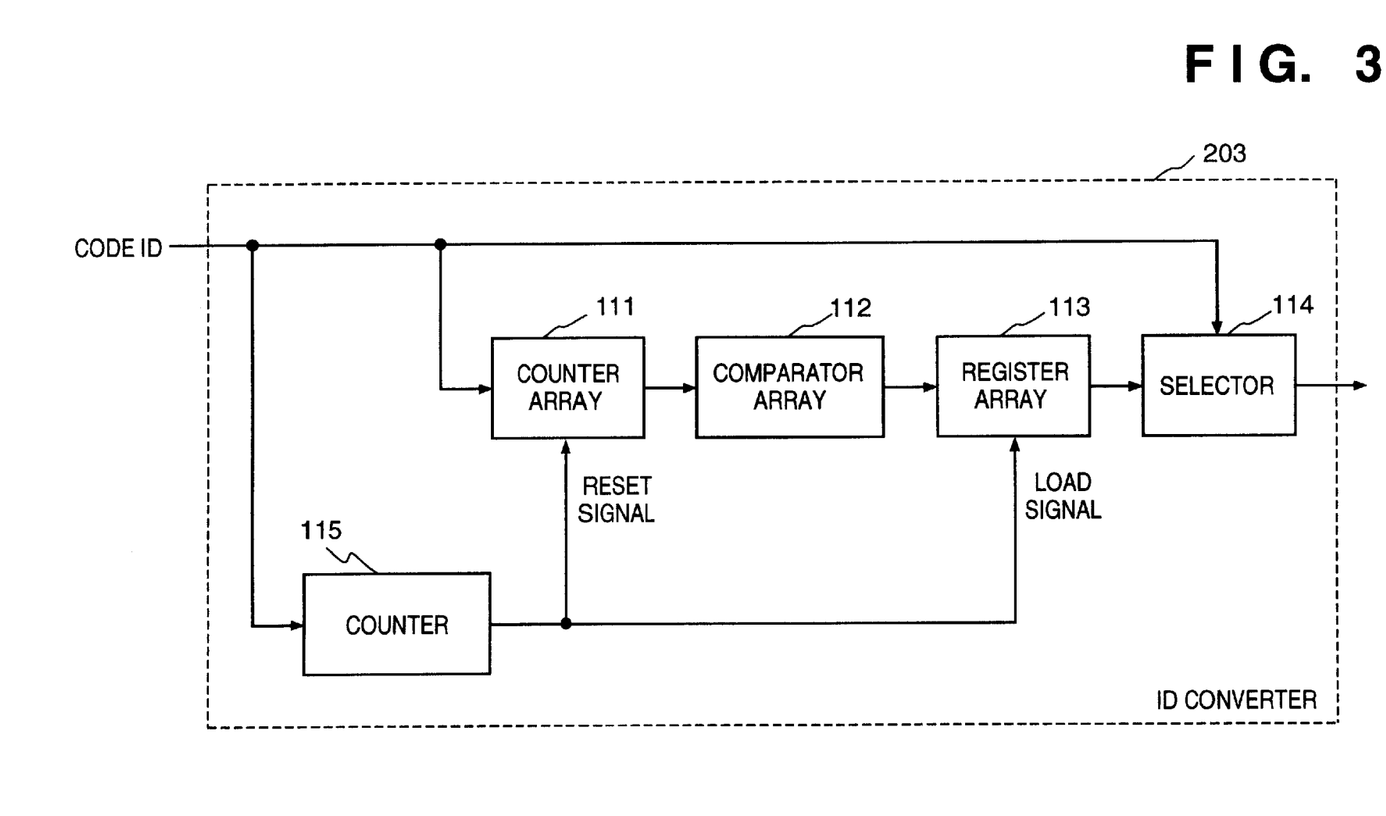
FIG. 3 is a block diagram illustrating the construction of an ID converter of an encoder according to a second embodiment of the present invention.

According to the second embodiment, the ID conversion table 103 of the first embodiment shown in FIG. 2 is replaced by an ID converter 203 having the construction shown in FIG. 3.

As shown in FIG. 3, the ID converter 203 includes a counter array 111, a comparator array 112, a register array 113, a selector 114 and a counter 115. Code IDs numbered in order of increasing code lengths enter the ID converter 203 from the code ID table 102.

In this embodiment, the counter array 111 is composed of ID counters the number of which is the same as the number of symbols. After the ID counters have been reset in units of a prescribed number of symbols, only the counter which corresponds to an entered code ID is incremented.

The comparator array 112 compares the values of the counts in the ID counters of the counter array 111 and outputs numbers in ascending order starting from "0" in order of decreasing value of the count. In case of identical frequency, the smaller number is outputted by giving preference to the smaller code ID.

In this embodiment, the register array 113 is composed of rank registers the number of which is the same as the number of symbols. The register array 113 loads and holds the output of the comparator array 112 in units of a prescribed number of symbols, namely the rank of each of the code IDs arrayed in order of frequency per prescribed number of symbols.

The selector 114 selects and outputs the value of a rank register in the register array 113 that corresponds to the entered code ID, namely the rank (of numbers) arrayed in order of frequency per prescribed number of symbols.

The counter 115 is a divide-by-M counter for initializing the counter array 111 and the register array 113. The counter 115 counts entered code IDs and, when the value of the count reaches a prescribed number M, applies a reset signal to the counter array 111 and a load signal to the register array 113 and simultaneously resets the value of its own count.

By virtue of this series of operations, entered code IDs are converted to numbers indicating order of frequency in prescribed symbol units and the numbers are supplied to the code table 104 and code-length table 105 as the output of the ID converter 203.

In the description rendered above, the counter array 111 is reset in prescribed symbol units. However, an arrangement may be adopted in which an initial value is loaded in each ID counter in prescribed symbol units. If such an arrangement is adopted, the order of priority of each code ID can be controlled by the value loaded in each ID counter.

Thus, in accordance with the embodiment as described above, the frequency of generation of each symbol is measured in units of a prescribed number of symbols, the rank of symbol generation frequency is decided and the rank is adopted as the converted code ID, whereby the ID conversion can be implemented by a simple circuit arrangement (or by simple processing).

Third Embodiment

An encoding apparatus according to a third embodiment of the invention will now be described. Elements in the third embodiment substantially similar to those of the first embodiment are designated by like reference characters and need not be described again in detail.

Figure 4:
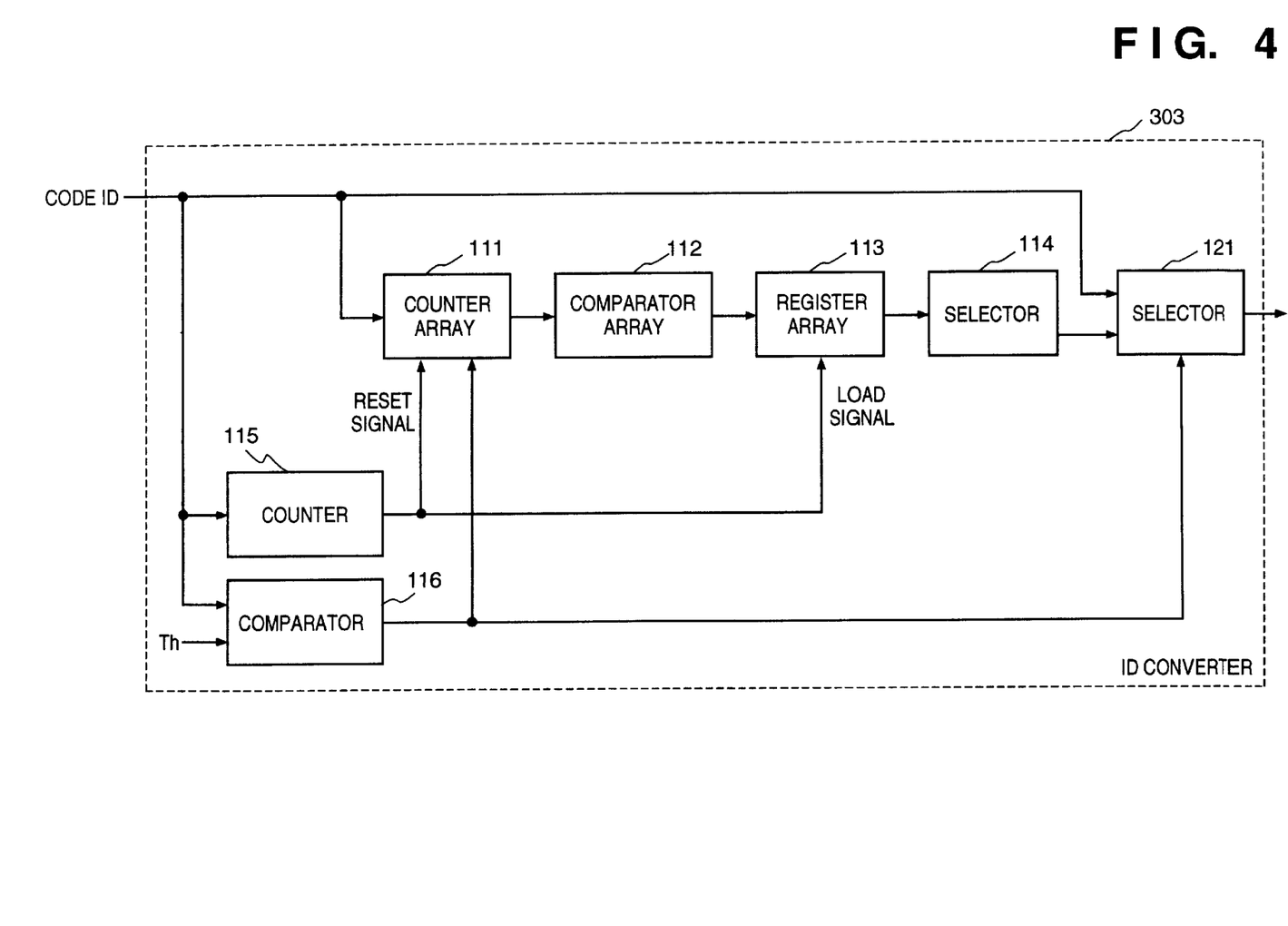
FIG. 4 is a block diagram illustrating the construction of an ID converter of an encoder according to a third embodiment of the present invention.

In the third embodiment, the ID conversion table 103 of the first embodiment depicted in FIG. 2 is replaced by an ID converter 303 having the construction shown in FIG. 4. Components identical with those of the ID converter of the second embodiment shown in FIG. 3 are designated by like reference characters and need not be described again in detail.

The ID converter 303 shown in FIG. 4 includes a comparator 116 and a selector 121. Only components different from those of the second embodiment will be described.

The comparator 116 compares an input code ID with a threshold value Th and delivers the results of the comparison to the counter array 111 and selector 121.

In this embodiment, the counter array 111 is composed of ID counters the number of which is equal to the threshold value Th. After the ID counters have been reset in units of a prescribed number of symbols, only the counter which corresponds to an entered code ID is incremented if the results of comparison performed by the comparator 116 indicate that the code ID is less than the threshold value Th.

The selector 114 selects and outputs the value of a rank register in the register array 113 that corresponds to the entered code ID, namely the rank (of numbers) arrayed in order of frequency per prescribed number of symbols. However, since the counter array 111 counts only code IDs that are less than the threshold value, the selector 114 also outputs the rank corresponding to a code that is less than the threshold value.

In a case where the results of the comparison performed by the comparator 116 indicate that a code ID is less than the threshold value, the selector 121 selects and delivers the output of the selector 114; otherwise, the selector 121 selects and delivers the entered code ID.

By virtue of this series of operations, code IDs less than the entered threshold value Th, namely Th-1 higher order code IDs, are converted to numbers indicating order of frequency in prescribed symbol units and the numbers are supplied to the code table 104 and code-length table 105 as the output of the ID converter 303.

By thus restricting code IDs that are the object of conversion to a prescribed number (Th-1) of higher order code IDs, it is possible to limit an increase in the size of hardware (or an increase in computations) that accompanies an increase in the number of symbols. Ordinarily, the total of the appearance probabilities of code IDs of the number of higher-order code IDs approaches unity and there is almost no decline in encoding efficiency even if this limitation is imposed.

Thus, in accordance with the embodiment as described above, hardware size (or amount of computation) can be reduced by limiting, to a prescribed number, the symbols for which frequency of occurrence is measured.

Fourth Embodiment

An encoding apparatus according to a fourth embodiment of the invention will now be described. Elements in the fourth embodiment substantially similar to those of the first embodiment are designated by like reference characters and need not be described again in detail.

Figure 5:
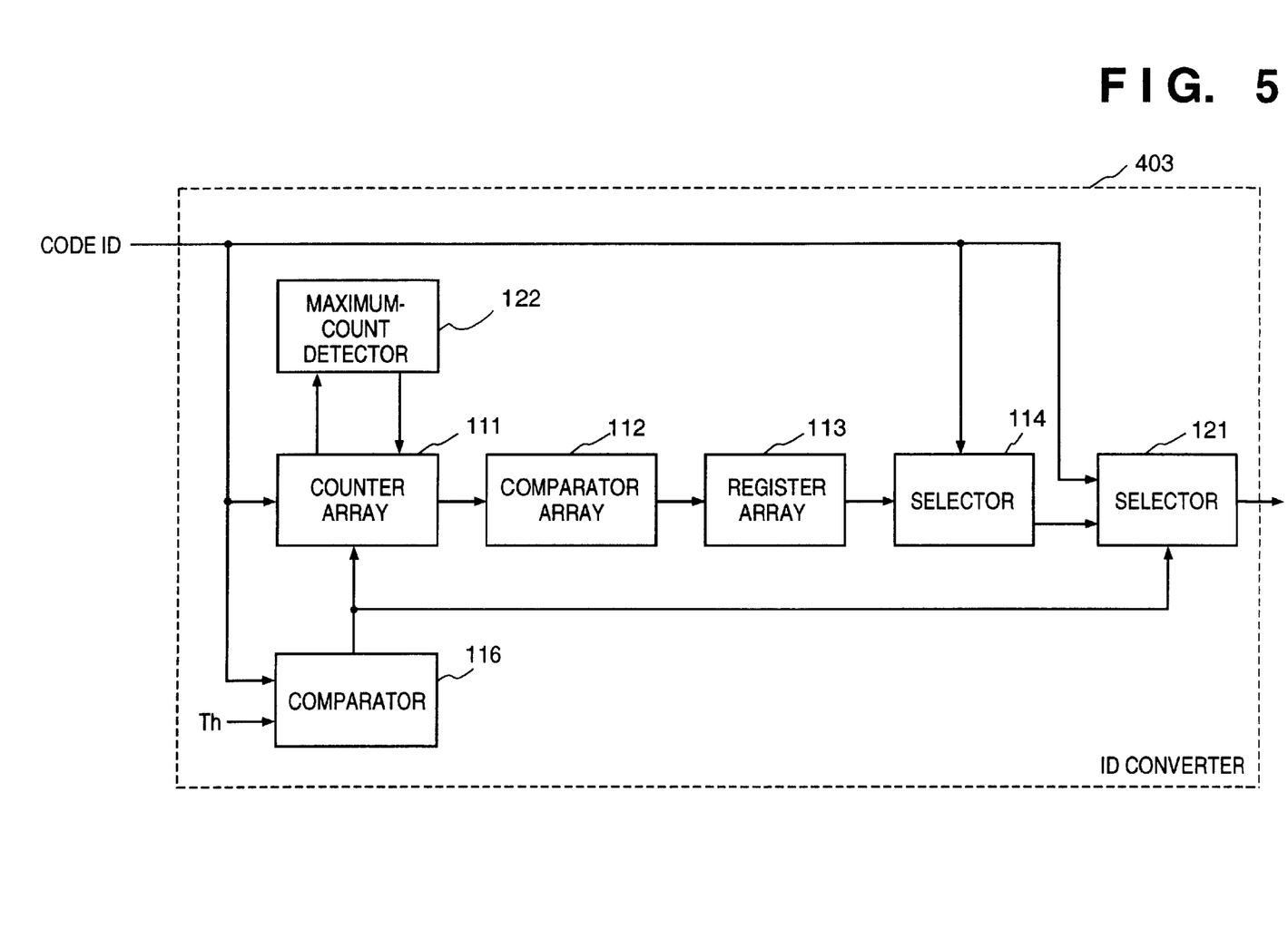
FIG. 5 is a block diagram illustrating the construction of an ID converter of an encoder according to a fourth embodiment of the present invention.

In the fourth embodiment, the ID conversion table 103 of the first embodiment depicted in FIG. 2 is replaced by an ID converter 403 having the construction shown in FIG. 5. Components identical with those of the ID converters 203, 303 shown in FIGS. 3 and 4 are designated by like reference characters and need not be described again in detail.

The ID converter 303 shown in FIG. 5 includes a maximum-count detector 122. Only components different from those of the second and third embodiments will be described.

The maximum-count detector 122 monitors the values of the counts in the ID counters of the counter array 111. When any ID counter attains the maximum count, the detector 122 shifts rightward the bits of the counts of the ID counters so as to halve the value of the count. At the start of encoding, a prescribed value in accordance with occurrence probability at the time the code ID table 102 is created is loaded in each ID counter.

Thus, a method of halving the value of the count in each ID counter is used as a countermeasure for overflow of the counter array 111. As a result, resetting per prescribed symbol units is unnecessary. Moreover, the maximum count of an ID counter can be set to a comparatively small value, thus making it possible to reduce the size of hardware (or the amount of computations). Further, since the occurrence probability of a code ID is re-evaluated whenever a symbol is entered, adaptive processing in symbol units is possible. In such case the register array 113 operates as a simple delay device (latch).

Thus, in accordance with the embodiment as described above, the frequency of occurrence of each symbol is counted. If the occurrence frequency attains the maximum count of a counter, the bits of the count in all counters are shifted to the right to halve the value of the count, thereby making it unnecessary to reset the counter in units of a prescribed number of symbols. Moreover, since the maximum count can be set to a comparatively small value, it is possible to reduce the size of hardware (or the amount of computations). Further, since the occurrence probability of a code ID is re-evaluated whenever a symbol is entered, adaptive processing in symbol units is possible.

Fifth Embodiment

An encoding apparatus according to a fifth embodiment of the invention will now be described. Elements in the fifth embodiment substantially similar to those of the first embodiment are designated by like reference characters and need not be described again in detail.

Figure 6:
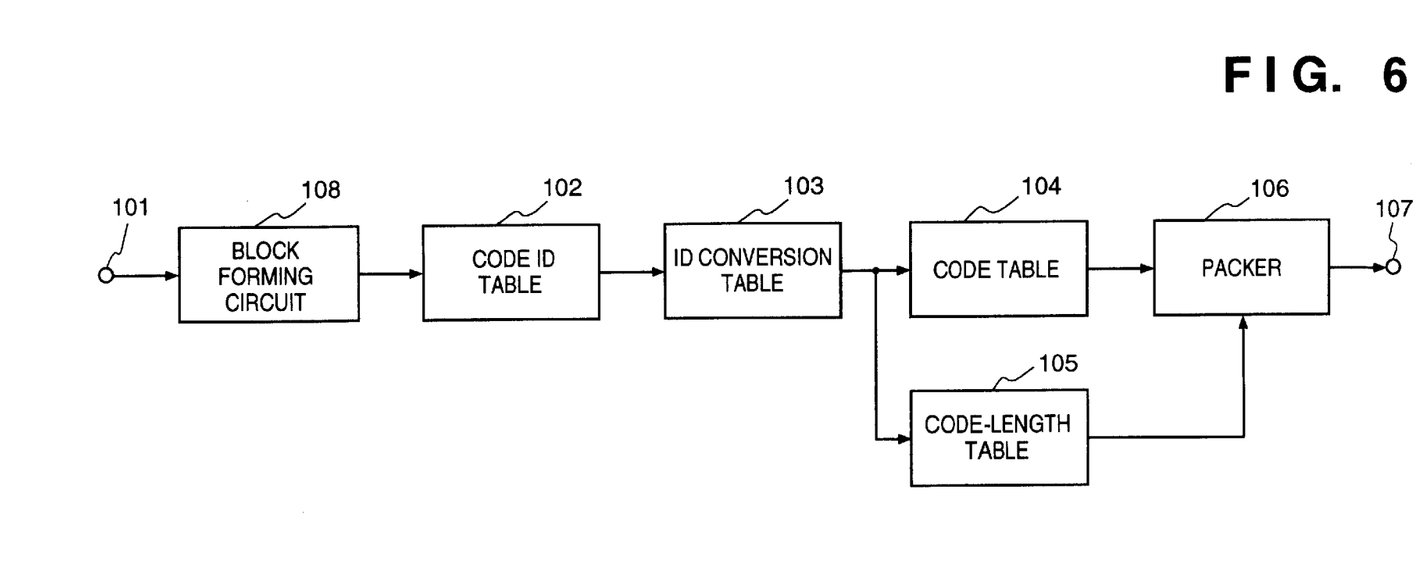
FIG. 6 is a block diagram illustrating the construction of an encoder according to a fifth embodiment of the present invention.

The fifth embodiment is obtained by adding a block forming circuit 108 to the first embodiment of FIG. 2, as illustrated in FIG. 6. The block forming circuit 108 cuts out entered symbols into blocks of a prescribed size. The resulting block is entered into the code ID table 102, after which encoding processing similar to that of the first embodiment is applied.

FIG. 6 illustrates an example having the ID conversion table 103. However, this can be replaced by the ID converter 203 (or 303, 403). In such case the units in which totalization is performed by the counter array 111 is set to a whole-number multiple of the block size and resetting of the counter array 111 and loading of the register array 112 are synchronized to a block beginning signal (not shown) outputted by the block forming circuit 105.

In general, two-dimensional data such as image data is data in which there is a strong correlation between mutually adjacent pixels. Accordingly, performing encoding after the data is formed into blocks concentrates the distribution of symbols and raises the efficiency of encoding. In this embodiment, the resetting of the counter array 111 and the loading of the register array 113 are synchronized to the block beginning signal, thereby improving follow-up of a local change in occurrence probability and raising greatly the efficiency of encoding.

Thus, in accordance with the embodiment as described above, encoding is carried out after entered symbols are formed into blocks, thereby concentrating the distribution of symbols and raising the efficiency of encoding. In addition, the resetting of the counter array and the loading of the register array are synchronized to the beginning of a block, thereby improving follow-up of a local change in occurrence probability and raising greatly the efficiency of encoding.

Sixth Embodiment

An encoding apparatus according to a sixth embodiment of the invention will now be described. Elements in the sixth embodiment substantially similar to those of the first embodiment are designated by like reference characters and need not be described again in detail.

Figure 7:
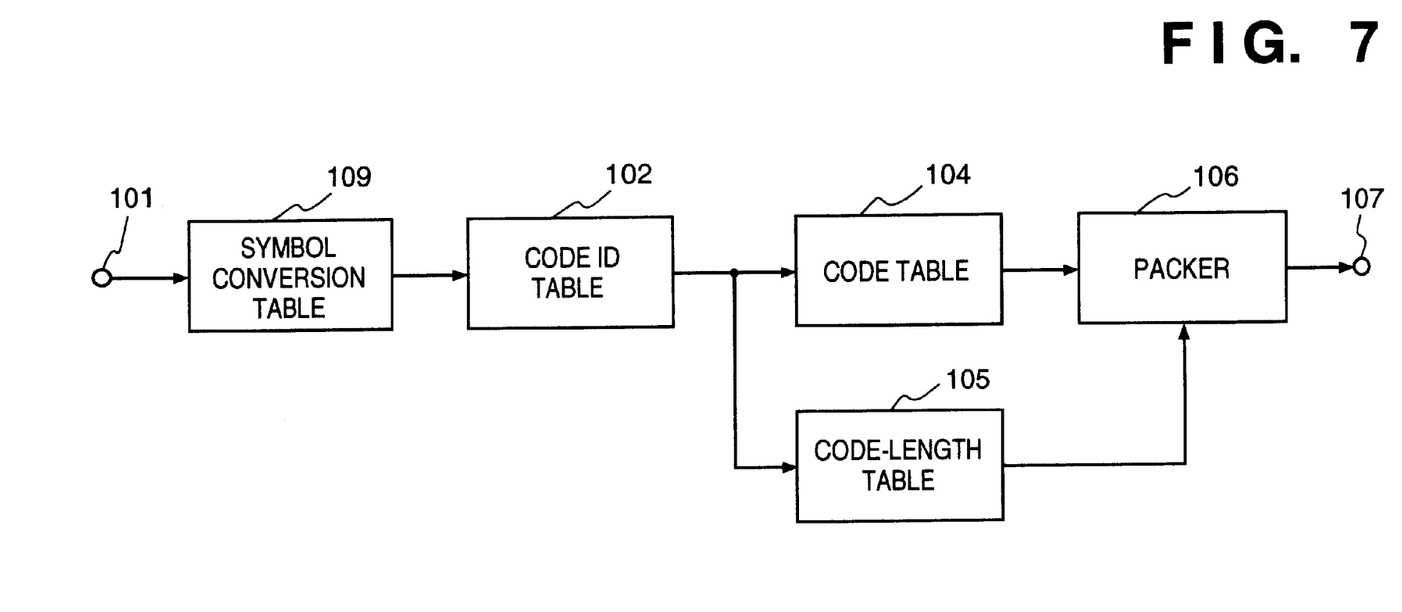
FIG. 7 is a block diagram illustrating the construction of an encoder according to a sixth embodiment of the present invention.

FIG. 7 is a block diagram illustrating the construction of an encoder according to a sixth embodiment of the present invention. Elements the same as those of the encoder illustrated in FIG. 1 are designated by like reference characters and need not be described again.

In FIG. 7, numeral 109 denotes a symbol conversion table. Only components different from those of the encoder shown in FIG. 1 will be described.

The symbol conversion table 109 replaces symbols that have entered from the input terminal 101. A symbol that has undergone replacement is entered into the code ID table 102, after which encoding processing similar to that performed by the encoder of FIG. 1 is executed. The symbol conversion table 109 is updated every prescribed number of symbols (or at every change of frequency) in accordance with the local generation frequency (occurrence frequency) of an entered symbol. In other words, by dynamically modifying the correspondence between Huffman codes and symbols by symbol replacement, short code words are assigned in accordance with the local occurrence probability of a symbol, thereby suppressing a decline in encoding efficiency.

The local occurrence probability of a symbol is obtained as by a CPU, not shown, and updating of the table is performed by the same CPU. However, in a case where a certain symbol has taken on the same frequency as that of another symbol, the table is not updated.

In order to achieve matching on the decoding side, the local occurrence probability of a symbol is obtained from a symbol that has already been outputted. As a result, it is possible to modify the correspondence between Huffman codes and symbols without additional information even on the decoding side.

Further, an arrangement may be adopted in which (S+N)-number of Huffman codes, namely a number of Huffman codes N larger than the number S of symbols, are generated, all symbols are allocated to codes other than N-number of codes starting from the shortest code and symbols, for which the rank of local generation frequency (occurrence probability) is included in the higher order N, are re-allocated to N-number of codes starting from the shortest code. In this case, addresses of symbols for which the rank of generation frequency is included in the higher order N need only be stored in the symbol conversion table 109, thus making it possible to reduce hardware size (amount of computation).

Thus, since the encoder of this embodiment merely performs the symbol conversion immediately prior to the encoding stage, the components from the code ID table 102 onward may be exactly the same as those of the basic arrangement shown in FIG. 1. More specifically, the code ID table 102, the code table 104 and the code-length table 105 can be consolidated and realized using a single LUT.

Thus, in accordance with this embodiment as described above, a symbol whose frequency has been reversed is replaced at the stage immediately prior to encoding. As a result, the components from the code ID table onward may be exactly the same as those of the basic arrangement shown in FIG. 1.

Seventh Embodiment

An encoding apparatus according to a seventh embodiment of the invention will now be described. Elements in the seventh embodiment identical with those of the first embodiment are designated by like reference characters and need not be described again in detail.

Figure 8:
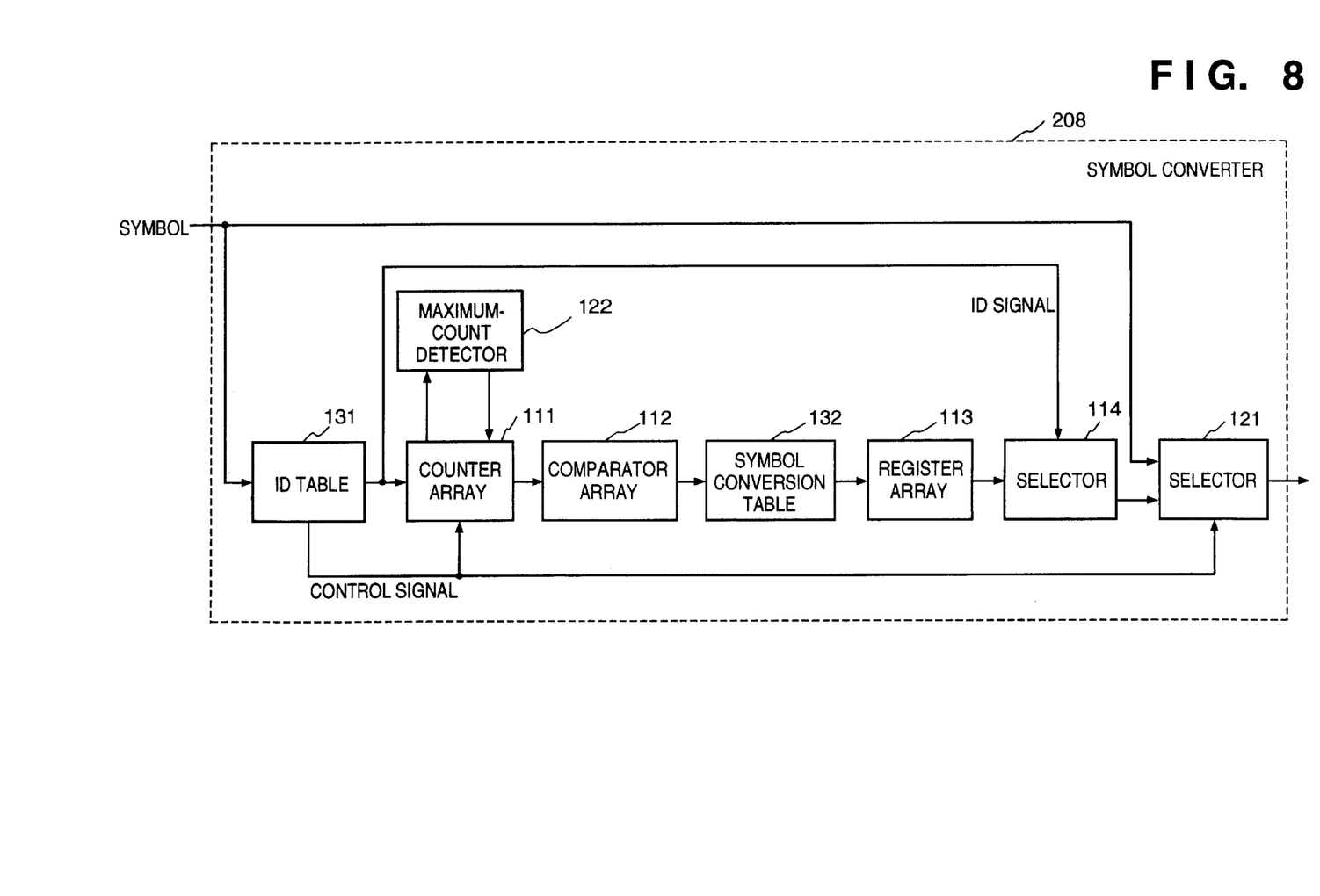
FIG. 8 is a block diagram illustrating the construction of a symbol converter of an encoder according to a seventh embodiment of the present invention.

The encoder of the seventh embodiment is obtained by replacing the symbol conversion table 109 of the sixth embodiment shown in FIG. 7 with a symbol converter 208 having the construction shown in FIG. 8. Components identical with those of the ID converter 403 of the fourth embodiment shown in FIG. 5 are designated by like reference characters and need not be described again in detail.

In FIG. 8, numeral 131 denotes an ID table and 132 a symbol conversion table. Only components different from those of the second and fourth embodiments will be described.

The ID table 131 converts only a prescribed N-number of symbols from among entered symbols to ID signals and outputs a control signal to the counter array 111 and selector 121.

In a case where the fact that a conversion has been executed is indicated by the control signal that enters from the ID table 131, ID counters in the counter array 11 that correspond to the ID signals which have entered from the ID table 131 are incremented.

The symbol conversion table 132 converts the rank (number), which has been outputted by the comparator array 112, to a symbol conforming to the rank. This symbol is held in the register array 113 and is selected by the selector 114 in dependence the ID signal outputted by the ID table 131.

In a case where the fact that a conversion has been executed is indicated by the control signal that enters from the ID table 131, the selector 121 selects the output of the selector 114; otherwise, the selector 121 selects and outputs the input symbol.

By virtue of this series of operations, N-number of symbols can be replaced in the order of local symbol occurrence.

Thus, in accordance with the embodiment as described above, only prescribed symbols are replaced by means of the ID table, thereby making it possible to construct a symbol converter by a simple circuit construction (or through simple processing).

Eighth Embodiment

An encoding apparatus according to an eighth embodiment of the invention will now be described. Elements in the eighth embodiment identical with those of the first embodiment are designated by like reference characters and need not be described again in detail.

Figure 9:
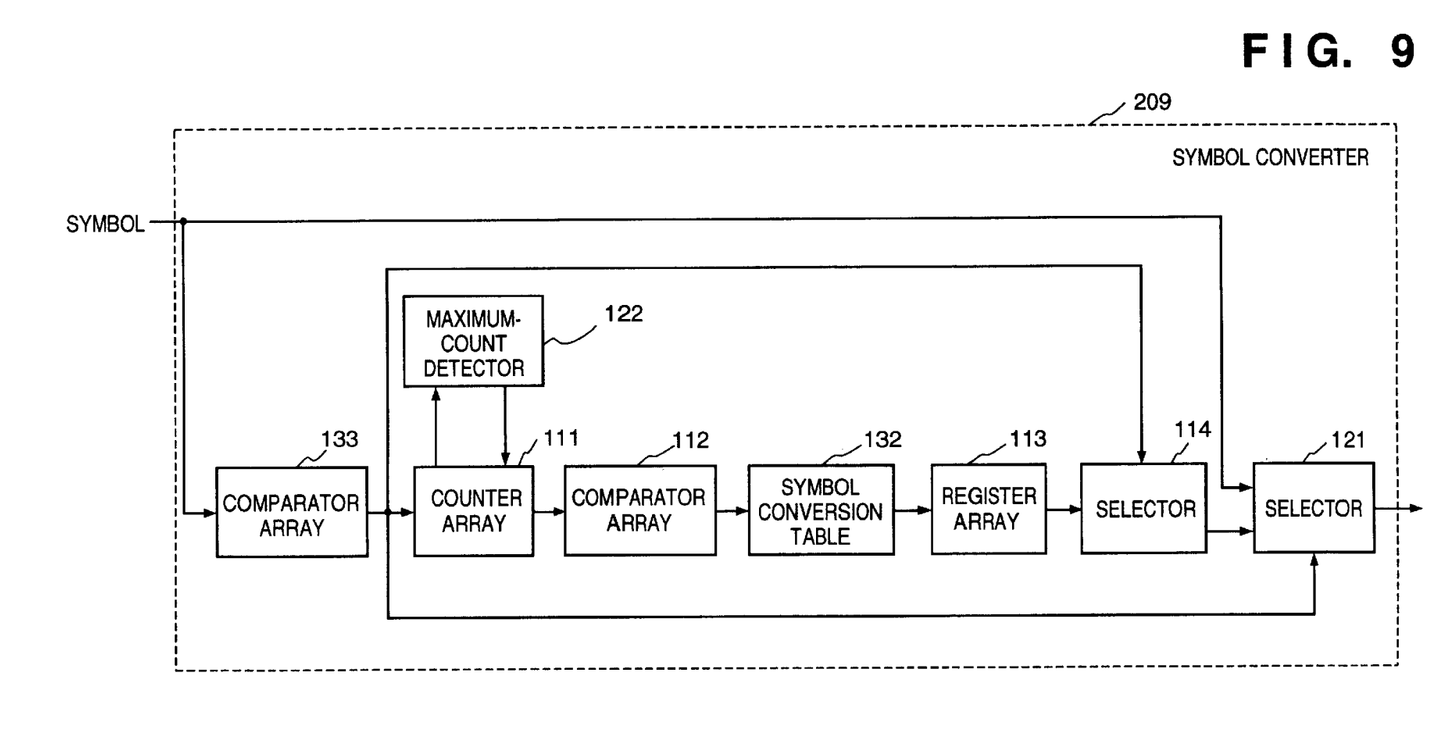
FIG. 9 is a block diagram illustrating the construction of a symbol converter of an encoder according to an eighth embodiment of the present invention.

The encoder of the eighth embodiment is obtained by replacing the symbol conversion table 109 of the sixth embodiment shown in FIG. 7 with a symbol converter 209 having the construction shown in FIG. 9. Components identical with those of the ID converter 203 of the fourth embodiment shown in FIG. 5 and the symbol converter 208 depicted in FIG. 8 are designated by like reference characters and need not be described again in detail.

In FIG. 9, numeral 133 denotes a comparator array. Only components different from those of the second, fourth and seventh embodiments will be described.

The comparator array 133 includes a plurality of symbol comparators in which symbols desired to be replaced have been set. The results of the comparison performed by each symbol comparator are sent to the counter array 111, selector 114 and selector 121.

If the results of comparison performed by a symbol comparator indicates agreement, only the counter in the counter array 111 that corresponds to this symbol comparator is incremented.

In a case where the results of comparison performed by a symbol comparator indicates agreement, the selector 114 selects the value of the register in the register array 113 that corresponds to this symbol comparator. In a case where the results of comparison performed by any symbol comparator indicates agreement, the selector 121 selects the output of the selector 114; otherwise, the selector 121 selects and outputs the input symbol.

By virtue of this series of operations, symbols desired to be replaced can be replaced in the order of local symbol occurrence. It should be noted that this embodiment is such that the ID table 131 of the seventh embodiment is replaced by the comparator array 133. However, in a case where the number of symbols desired to be replaced is small, this embodiment provides a greater reduction in the size of hardware (or in the amount of processing).

Thus, in accordance with the embodiment as described above, only symbols detected by a comparator are replaced. As a result, in a case where the number of symbols desired to be replaced is small, it is possible to construct a symbol converter by a very simple circuit construction (or through very simple processing).

Thus, in accordance with the present invention, it is possible to prevent, through a simple arrangement or processing, a decline in the efficiency of encoding of data in which there is a dynamic variation in the probability distribution (occurrence probability) of symbols.

The present invention can be applied to a system constituted by a plurality of devices or to an apparatus comprising a single device.

Furthermore, the invention is applicable also to a case where the invention is embodied by supplying a program to a system or apparatus. In this case, a storage medium, storing a program according to the invention constitutes the invention. The system or apparatus installed with the program read form the medium realizes the functions according to the invention.

As many apparently widely different embodiments of the present invention can be made without departing from the spirit and scope thereof, it is to be understood that the invention is not limited to the specific embodiments thereof except as defined in the appended claims.

What is claimed is:

1. An encoding apparatus comprising:
    an inputter, arranged to input plural coding units, where each coding unit has a prescribed number of symbols;
    a modifier, arranged to modify current generation frequencies of symbols detected by a current coding unit, to prescribed values before next generation frequencies of the symbols are detected from a next coding unit;
    an updater, arranged to update a correspondence of the symbols to code words based upon the current generation frequencies before the next generation frequencies are detected from the next coding unit;
    a converter, arranged to convert the symbols included in the next coding unit to the code words in accordance with the updated correspondence; and
    a detector, arranged to detect the next generation frequencies from the next coding unit using the modified current generation frequencies.

2. The apparatus according to claim 1, wherein the modifier modifies the current generation frequencies to initial values before the next generation frequencies detected from the next coding unit.

3. The apparatus according to claim 1, wherein the updater updates the correspondence based on the order of the symbols in accordance with the current generation frequencies.

4. An encoding apparatus comprising:
    a block former, arranged to divide an image into plural blocks, each block having a prescribed number of pixels;
    a modifier, arranged to modify current generation frequencies of symbols detected from a current block, to prescribed values before next generation frequencies of the symbols are detected from a next block;
    an updater, arranged to update the correspondence of the symbols to code words based upon the current generation frequencies before the next generation frequencies are detected from the next block;
    a converter, arranged to convert the symbols included in the next block to the code words in accordance with the updated correspondence; and
    a detector, arranged to detect the next generation frequencies from the next block using the modified current generation frequencies.

5. The apparatus according to claim 4, wherein said modifier modifies the current generation frequencies to initial values before the next generation frequencies are detected from the next block.

6. The apparatus according to claim 4, wherein said updater updates the correspondence based on an order of the symbols in accordance with the current generation frequencies.

7. An encoding method comprising the steps of:
    inputting plural coding units, each coding unit has a prescribed number of symbols;
    modifying current generation frequencies of symbols detected from a current coding unit, to prescribed values before next generation frequencies of the symbols are detected from a next coding unit;
    updating a correspondence of the symbols to code words based on the current generation frequencies before the next generation frequencies are detected from the next coding unit; and
    converting the symbols included in the next coding unit to the code words in accordance with the updated correspondence; and
    detecting the next generation frequencies from the next coding unit using the modified current generation frequencies.

8. The method according to claim 7, wherein said modifying step modifies the current generation frequencies to initial values before the next generation frequencies are detected from the next coding unit.

9. The method according to claim 7, wherein said updating step updates the correspondence based on an order of the symbols in accordance with the current generation frequencies.

10. An encoding method comprising the steps of:
    dividing an image into plural blocks, each block having a prescribed number of pixels;
    modifying current generation frequencies of symbols detected from a current block, to prescribed values before next generation frequencies of the symbols are detected from a next block;
    updating a correspondence of the symbols to code words based on the current generation frequencies before the next generation frequencies of symbols are detected from the next block;
    converting the symbols included in the next block to the code words in accordance with the updated correspondence; and
    detecting the next generation frequencies from the next block using the modified current generation frequencies.

11. The method according to claim 10, wherein said modifying step modifies the current generation frequencies to initial values before the next generation frequencies are detected from the next block.

12. The method according to claim 10, wherein said updating step updates the correspondence based on an order of the symbols in accordance with the current generation frequencies.

* * * * *

UNITED STATES PATENT AND TRADEMARK OFFICE
CERTIFICATE OF CORRECTION

PATENT NO.    : 6,252,992 B1
DATED         : June 26, 2001
INVENTOR(S)   : Hisashi Ishikawa It is certified that error appears in the above-identified patent and that said Letters Patent is hereby corrected as shown below:

Column 8,
Line 12, "array 11" should read -- array 111 --.

Column 9,
Line 23, "form" should read -- from --; and
Line 50, "detected" should read -- are detected --.

Column 10,
Line 15, "has" should read -- having --.

Signed and Sealed this

Eighteenth Day of March, 2003

JAMES E. ROGAN
*Director of the United States Patent and Trademark Office*